United States Patent [19]

Slutsky et al.

[11] Patent Number: 5,756,008

[45] Date of Patent: May 26, 1998

[54] WATER CLEANABLE SILVER COMPOSITION

[75] Inventors: Joel Slutsky, Chapel Hill; Jay Robert Dorfman, Durham, both of N.C.; William H. Morrison, Jr., Wilmington, Del.

[73] Assignee: E. I. du Pont de Nemours and Company, Wilmington, Del.

[21] Appl. No.: 702,398

[22] Filed: Aug. 14, 1996

[51] Int. Cl.$^6$ ...................................... H01B 1/22
[52] U.S. Cl. ................... 252/514; 524/439; 524/440; 427/125; 427/353
[58] Field of Search ............... 252/514; 524/439, 524/440; 427/125, 353

[56] References Cited

U.S. PATENT DOCUMENTS 4,510,275 4/1985 Ihikura et al. .................. 523/412
5,286,415 2/1994 Buckley et al. .................. 252/502
5,492,653 2/1996 Hochheimer et al. .............. 252/514
5,565,143 10/1996 Chan ............................ 252/514

*Primary Examiner*—Paul Lieberman
*Assistant Examiner*—Mark Kopec

[57] ABSTRACT

A silver composition is disclosed which contains silver powder or flake, a water soluble binder, an organic water soluble solvent and an inorganic binder. Generally, the composition will also contain water. The water soluble binder is especially chosen such that it has the property after dissolution in water, followed by water removal that it can be again dissolved in water (as opposed to water resistance as in a paint). The silver composition as a film or coating also lacks water resistance (prior to a firing operation) which can aid in pattern formation.

8 Claims, No Drawings

WATER CLEANABLE SILVER COMPOSITION

FIELD OF THE INVENTION

The present invention is directed to a silver containing composition which is compatible with water and particularly to such compositions which form a film or coating on a substrate which prior to firing can be cleaned, i.e., removed with water.

BACKGROUND OF THE INVENTION

Environmental pressures have essentially eliminated the use of chlorinated organic solvents from the thick film industry. These solvents were widely used to clean equipment used in the thick film industry. Water cleanable compositions offer significant environmental advantages. Therefore, a need exists in formation of electrically conductive silver circuitry from a silver containing paste to be compatible with water. In the present invention, the use of organic solvents is minimized or eliminated together with a negative impact due to volalites and/or organic contamination or a need for clean-up using organic solvents. Until now, the development of aqueous compatible silver containing compositions nevertheless has been unsatisfactory.

Hochheimer et al. U.S. Pat. No. 5,492,653 discloses a coating composition of silver flake coated with lubricant, a substantially completely water soluble binder, a substantially completely water soluble co-solvent and water. However, this composition in film formation cannot be cleaned by water, e.g., to remove the silver from a substrate.

Buckley et al. U.S. Pat. No. 5,286,415 discloses aqueous polymer thick film compositions containing a water soluble thermoplastic polymer, a water insoluble thermoplastic polymer, a water insoluble polymer dispersion, a glycol drying-retarder agent, conductive metal or carbon particles and water. The composition does not have the ability to be cleaned solely by use of water.

SUMMARY OF THE INVENTION

The present invention is directed to a silver composition comprising (a) 40–85% by weight silver powder, silver flake or combinations thereof;

(b) 2 to 6% by weight of water soluble polymer binder which meets the requirements of Test Method A;

(c) at least 0.5% by weight of organic water-soluble solvent; and (d) 0.1 to 3% by weight of inorganic binder, with the proviso that polymer binder contained in the composition meets the water solubility requirements of Test Method A and with the proviso that the silver composition, after drying to form a film or a coating on a substrate meets the requirements of Test Method B.

Generally, the compositions of the present invention will be aqueous-based, i.e., they will contain water.

TEST METHOD PROCEDURE

In the present disclosure two test methods are provided.

Test Method A is employed to define a water soluble polymer binder. In this test method the polymer initially forms a clear or substantially clear phase upon dissolution in water. However, the further requirement in this test method is that a dry film or dry coating formed on a substrate may be removed by water and the film will be dissolved to form a clear or substantially clear phase, i.e., a dry square film having each side of 2.5 centimeters and having a thickness of 0.005 centimeters and will dissolve when submerged for 5 minutes if water is maintained at 50° C.

Test Method B is employed to define a property of the silver composition following film formation, i.e., after removal of co-solvent and water. This property of the film is silver removal by use of a cotton swab, soaked in water and rubbed across the film ten times.

DETAILED DESCRIPTION OF THE INVENTION

The silver compositions of the present invention typically in an aqueous carrier can be applied to substrates by techniques such as dipping or spraying. The viscosity of the formulation can be readily adjusted to its end use application by the concentration of the liquid carrier.

It is a requirement with the silver compositions disclosed herein that they have the ability of water clean-up after drying to form a film or a coating on a substrate (but before any firing operation). Illustratively, the silver compositions can be coated onto a surface of a substrate, typically a dielectric, which can withstand a firing operation to fuse inorganic binder present in the silver composition. With the silver composition, desired portions of the composition present as a film after drying can be readily removed with a water wash. For example, such removal can be accomplished by use of a mask to protect portions of the silver composition which is not to be removed but allows removal of unmasked areas. This ability of silver composition removal overcomes the necessity of abrasive removal of silver composition areas which is known in the art.

This ability for aqueous removal directly contrasts formulations disclosed in Hochheimer et al. U.S. Pat. No. 5,492,653. Although this patent directly discloses aqueous silver compositions with a water soluble binder, such compositions can withstand exposure to water after dry film formation; in a similar manner as an aqueous based paint can withstand contact with water after drying, such as a painted house. This property is absent in the formulations of the present invention since it is undesirable.

A component in the silver composition is silver which can be present as a powder or flake or combination. The size of the powder or flake is not critical and commercially available silvers can be readily employed. Typically if a flake is used, it contains an additive from the manufacturing process such as a surfactant to stabilize the flake. Typical surfactants are nonionic or ionic including fatty acids and derivatives and polyethylene oxide phosphate. The concentration of silver in the final formulation can vary within wide limits such as 40 to 85% by weight. A preferred range to 50 to 80% and more preferred 60 to 80%.

The silver composition further contains a polymeric binder which is water soluble. As employed herein, water solubility denotes the binder will form a clear phase or substantially clear phase upon dissolution. A further requirement for the polymeric binder is that it meets the requirements of Test Method A. Thus, the polymeric binder will have water solubility but after dissolution in water followed by water removal to effect formation of a film or a coating on a substrate; the film will not be able to withstand water contact without dissolution. This latter property differs from the water soluble binders disclosed in Hochheimer et al. U.S. Pat. No. 5,492,653 and specifically the acrylic polymers and copolymers disclosed on column 3, lines 42 to 50 and the specific representative commercially available polymeric binders disclosed on column 4, lines 9 to 26 of this patent.

Representative water soluble polymeric binders within the scope of the present invention include: polyvinylpyrrolidone homopolymers and copolymers such as having a weight average molecular weight of 12,000 to 2,800,000. Useful copolymers include vinyl acetate and 1-hexadecene. Further examples of polymeric binders are hydroxypropyl cellulose, hydroxymethyl cellulose, and hydroxyethyl cellulose. The concentration of polymeric binder will typically be in a range from 2 to 6% by weight of the composition, preferably 3 to 5% and more preferably 3.5 to 4.5%.

A further required constituent is a solvent which is water soluble, i.e., the solvent forms a clear or substantially clear phase upon dissolution in water. It is considered that the solvent is a surface tension modifier and helps retard the entrainment of undesirable bubble formation in the silver composition. Also, the solvent may improve the green strength of the dried silver film before firing and may improve adhesion of the dried silver film on a substrate.

Generally, the solvent is present in a concentration in the silver composition of at least 0.5%. It is within the scope of the present invention that water need not be present in the silver composition. Therefore, the solvent can be any amount needed for the liquid phase to allow the remaining constituents to be within the specified ranges. However, in preferred embodiments, water will be present in the silver formulation. A suitable range for the solvent in the composition is 0.5–12% wt. in a water containing composition. A preferred lower limit for the solvent is 1.5% by weight.

Examples of suitable solvents are alcohols, glycols and alkanols such as ethylene glycol, propylene glycol, diethyleneglycol monoethylether and diethyleneglycol monobutylether, pentanol and hexanol.

Another constituent in the silver composition is an inorganic binder. Such binders are well known in the art and include frits such as bismuth lead borosilicate and metal oxides such as iron oxide and copper oxide. A typical range of inorganic binder is from 0.1 to 3% by weight, preferably 0.2 to 2% and more preferred 0.5 to 0.8%. If the silver composition is not fired at elevated temperature, e.g., above 500° C. the inorganic binder would be omitted.

In addition, the silver composition also can contain various additives which aid in optimizing properties. One additive is a surfactant which can be nonionic or ionic types. An example of a suitable surfactant is phosphated polyethylene oxide. Other additives include defoamers including silicone oils and modified polysilicone copolymers and antisettling agents such as clay or silicas.

As previously discussed, water is an optional component of the silver formulation. However, it is desirable in most instances that some water be present which will allow less water soluble solvent to be used.

The silver composition is typically employed as a coating on a substrate which can withstand a firing procedure. Initially, the silver composition is applied to the substrate by dipping, applying to walls of holes in the substrate or by spraying. Thereafter, the silver composition is dried to remove liquid which may be followed by formation of a pattern that leads to silver removal in appropriate areas. The process concludes with a firing operation taking place at temperatures of 500° C. to 900° C. and preferably at temperatures of at least 600° C.

The present invention will be described in further detail by giving practical examples. The scope of the present invention, however, is not limited in any way by these practical examples.

In the following examples all parts and percentages are by weight and degrees are in centigrade unless otherwise indicated.

EXAMPLES

Preparation of Silver Compositions

Step 1. The Batch ingredients shown in Table 1, column 1, (dip composition), were charged to a Power Mixer PD-10 (10 gal capacity) and mixed with the planetary blade at medium speed for 30 minutes with vacuum applied (27 in Hg). The mixer was stopped and the paddle, blade, and walls scraped down. After turning on cooling water and vacuum, the planetary mixer and disperser blades were turned on at low and high speeds, respectively, for 30 minutes. The mixer was stopped and fineness of grind evaluated. If $^{18}/_8$ (50% point/4th scratch) was not attained, additional 10 minute increments of dispersing was applied until fineness of grind was attained. The batch was transferred to a planetary mixer with 40 gal. change can.

Step 2. Additional pre-formulation ingredient(s) was added and the batch mixed for 30 minutes under vacuum.

Step 3. A final formulation step was carried out (in the same manner) to adjust the paste viscosity. For compositions shown in Table 1, columns 2 and 3, (spray and hole-coat compositions) the pre-formulation ingredient(s) were added before transferring to the planetary mixer and the ingredients were dispersed for 30 minutes with vacuum applied. After transferring the 40 gal. planetary mixer the pre-formulation and final formulation were carried out.

Alternatively, dispersion of paste ingredients was accomplished using a three roll mill after first mixing ingredient with a double planetary mixer (or equivalent). Formulation was done after dispersion.

A Power Versamix mixer was employed for vehicle production. The copolymer was slowly added to the stirred mixture of solvents and stirring continued for 2 hours or until the copolymer was completely dissolved. The composition was discharged through a 325 mesh screen.

TESTING

Test coupons were prepared by spraying 2×2 inch 96% alumina substrate with the silver composition using an airbrush. The approximate weight of wet paste deposited was 500mg. per substrate. The substrates were dried for 10 minutes in an air oven at 150° C. and then allowed to cool to room temperature. A cotton swab, soaked with water, was rubbed back and forth over the silver composition surface. The silver composition was easily removed with relatively few (about 5) strokes required.

TABLE 1

| Ingredient | Dip — Column 1 | Spray — Column 2 | Hole-coat — Column 3 |
|---|---|---|---|
| STEP 1 (Batch) | | | |
| silver flake A | 74.00 | | |
| silver flake B | | 65.00 | 65.00 |
| Frit A | 0.20 | 0.18 | 0.18 |
| cuprous oxide | 0.30 | 0.26 | 0.26 |
| iron oxide | | 0.26 | 0.26 |
| D. I. water | 2.00 | | |
| Vehicle A | 10.00 | | |
| Vehicle B | | 5.80 | |
| Vehicle C | | | 5.80 |

TABLE 1-continued

| Ingredient | Dip — Column 1 | Spray — Column 2 | Hole-coat — Column 3 |
|---|---|---|---|
| Gafac RE-610 | 0.20 | | |
| Aerosol OT | | 0.35 | 0.35 |
| Step 2 (Pre-formulation) | | | |
| vehicle B | | 3.00 | |
| vehicle C | | | 3.0 |
| propylene glycol n-propyl ether | | 3.70 | 1.85 |
| dipropylene glycol methyl ether | | | 1.85 |
| Step 3 (Final Formulation) | | | |
| D. I. water | 10.30 | 16.45 | 16.45 |
| D. I. water | 3.00 | 5.00 | 5.00 |

TABLE 2

| | Vehicle A | | Vehicle B | | Vehicle C | |
|---|---|---|---|---|---|---|
| ISP PVP-VA/S630 (vinyl-pyrrolidone/vinylacetate copolymer) | 37.0 | 3.7* | 40.0 | 3.52* | 40.0 | 3.52* |
| ethylene glycol n-butyl ether | 50.0 | 5.0* | | | | |
| D. I. water | 13.0 | | | | | |
| propylene glycol n-propyl ether | | | 60.0 | 8.98* | 30.0 | 4.49* |
| dipropylene glycol methyl ether | | | | | 30.0 | 4.49* |

*wt. % based on total composition (TABLE 1)

GLOSSARY

Frit A is a bismuth lead borosilicate frit having a softening point of 370° C.

Silver flake A has a coating containing a sodium salt of C12–C18 carboxylic acid.

Silver flake B has a oleic acid coating.

D.I. means deionized.

Vehicles A, B and C are shown in Table 2.

Gafac RE-610 is phosphated polyethylene oxide.

Aerosol OT is sodium dioctyl sulfosuccinate

What is claimed is:

1. A silver composition comprising
   (a) 40–85% by weight silver powder, silver flake or combinations thereof;
   (b) 2 to 6% by weight of water soluble polymer binder;
   (c) at least 0.5% by weight of organic water-soluble solvent;
   (d) 0.1 to 3% by weight of inorganic binder with the proviso that the total polymer binder contained in the composition, when in the form of a dry square having sides of 2.5 cm and a thickness of 0.005 cm disposed on a substrate, will dissolve and form a clear or substantially clear phase when submerged in water at 50° C. for 5 minutes, and wherein said silver composition, once applied to an alumina substrate and dried for 10 minutes in air at about 150° C., can be removed from said substrate by use of a cotton swab soaked in water and rubbed across the composition ten times.

2. The silver composition of claim 1 which contains water.

3. The silver composition of claim 1 which contains not more than 12% by weight of water soluble solvent.

4. The silver composition of claim 1 which contains 50 to 80% by weight of silver.

5. The silver composition of claim 1 which contains 3 to 5% by weight of water soluble binder.

6. The silver composition of claim 1 which contains 0.5 to 0.8% inorganic binder.

7. The silver composition of claim 1 which contains surfactant.

8. An aqueous silver composition comprising
   (a) 50 to 80% by weight silver powder, silver flake or combinations thereof;
   (b) 3 to 5% by weight of water soluble polymer binder;
   (c) 0.5 to 12% by weight of organic water soluble solvent;
   (d) 0.1 to 3% by weight of inorganic binder; and
   (e) water with the proviso that the total polymer binder contained in the composition, when in the form of a dry square having sides of 2.5 cm and a thickness of 0.005 cm disposed on a substrate, will dissolve and form a clear or substantially clear phase when submerged in water at 500° C. for 5 minutes, and wherein said silver composition, once applied to an alumina substrate and dried for 10 minutes in air at about 150° C., can be removed from said substrate by use of a cotton swab soaked in water and rubbed across the composition ten times.

* * * * *